(12) United States Patent
Luttikhuis et al.

(10) Patent No.: US 7,253,875 B1
(45) Date of Patent: Aug. 7, 2007

(54) LITHOGRAPHIC APPARATUS AND DEVICE MANUFACTURING METHOD

(75) Inventors: Bernardus Antonius Johannes Luttikhuis, Nuenen (NL); Engelbertus Antonius Fransiscus Van Der Pasch, Oirschot (NL); Ronald Van Der Ham, Maarheeze (NL); Niek Jacobus Johannes Roset, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/366,803

(22) Filed: Mar. 3, 2006

(51) Int. Cl.
*G03B 27/52* (2006.01)
*G03B 27/42* (2006.01)

(52) U.S. Cl. .......................................... 355/30; 355/55

(58) Field of Classification Search ................... 355/30, 355/52, 53, 55, 67–71; 356/399–401; 250/548
See application file for complete search history.

(56) References Cited

U.S. PATENT DOCUMENTS

| 6,208,407 B1 * | 3/2001 | Loopstra ..................... 355/53 |
| 6,630,984 B2 * | 10/2003 | Bisschops ................... 355/30 |
| 6,690,450 B2 * | 2/2004 | Nishi ......................... 355/30 |

* cited by examiner

*Primary Examiner*—Henry Hung Nguyen
(74) *Attorney, Agent, or Firm*—Pillsbury Winthrop Shaw Pittman LLP

(57) ABSTRACT

A lithographic apparatus includes a measurement system to measure the position and/or movement of a substrate support relative to a reference frame. The measurement system includes a target mounted to one of the substrate support and the reference frame, a radiation source mounted to the other one of the substrate support and the reference frame and a sensor configured to detect a pattern of radiation propagating from the target, indicating the position or movement of the substrate support. The substrate support includes one or more gas outlets configured to provide a flow of gas that encapsulates the volume of space through which the beam of radiation propagates to the target.

21 Claims, 6 Drawing Sheets

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a typical configuration of a lithographic apparatus, the substrate is held on a substrate support during the exposure process. In order to adjust the position of the substrate during an exposure or between exposures, the substrate support is moved. Typically, therefore, an actuator is provided that adjusts the position of the substrate support relative to a reference frame. In general, the position of the substrate relative to the substrate support is fixed and known. Therefore, the position of the substrate may be determined by monitoring the position of the substrate support. It has previously been known to monitor the position of a substrate support using interferometers and/or grating encoders. Such systems are capable of providing highly accurate position measurements. However, the accuracy of such systems may be reduced if the temperature and/or pressure and/or composition of the gas through which the beam of radiation used for the interferometer or grating encoder propagates, varies. For example, in order to provide sufficient accuracy for a lithographic apparatus, it may be desirable to limit the temperature variation to a range of +/−100 to 300 mK. This may be difficult to provide in a lithographic apparatus because there are significant sources of heating, such as the actuator for moving the substrate support and the radiation being imaged onto the substrate. Accordingly, the gas adjacent to the areas of heating are heated. The heated gas may then be pumped around the environment of the lithographic apparatus by the movement of the substrate support.

SUMMARY

It is desirable to provide a lithographic apparatus that has a measurement system of which the accuracy is reliable.

According to an embodiment of the invention, there is provided a lithographic apparatus, including: a reference frame; a measurement system configured to measure at least one of the position and the movement of a component of the lithographic apparatus relative to the reference frame; wherein the measurement system includes a target, mounted to one of the component and the reference frame; a radiation source, mounted to the other of the component and the reference frame, and configured to project a beam of radiation to the target; and a sensor, configured to detect a pattern of radiation propagating from the target that is indicative of the at least one of the position and the movement of the component relative to the reference frame; and the component includes one or more gas outlets configured such that, when a gas supply is provided to the gas outlets, the volume of space through which the beam of radiation propagates to the target is substantially encapsulated by a flow of gas from the one or more gas outlets.

According to an embodiment of the invention, there is provided a device manufacturing method including transferring a pattern from a patterning device onto a substrate using a lithographic apparatus wherein: an actuator is provided that is configured to move a component of the lithographic apparatus relative to a reference frame; the method includes controlling the actuator using a measurement system that is configured to measure at least one of the position and the movement of the component relative to the reference frame; the measurement system includes a target, mounted to one of the component and the reference frame; a radiation source, mounted to the other of the component and the reference frame, and configured to project a beam of radiation to the target; and a sensor, configured to detect a pattern of radiation, propagating from the target that is indicative of the at least one of the position and the movement of the component relative to the reference frame; and the method further includes providing a supply of gas to one or more gas outlets provided on the component such that the volume of space through which the beam of radiation propagates to the target is substantially encapsulated by a flow of gas from the one or more outlets.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
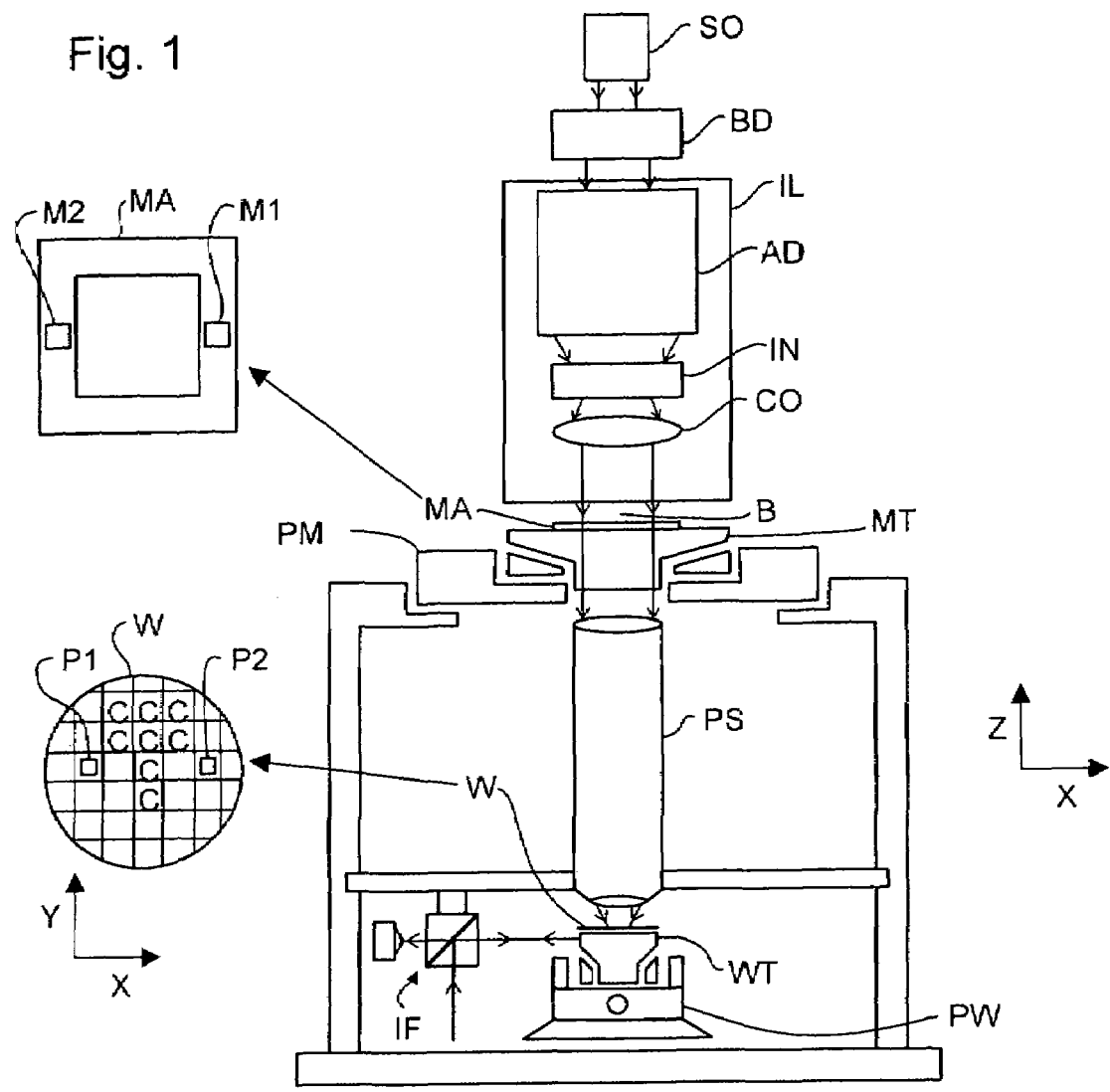
FIG. 1 depicts a lithographic apparatus according to an embodiment of the invention.

FIG. 1 schematically depicts a lithographic apparatus according to one embodiment of the invention. The apparatus includes: an illumination system (illuminator) IL configured to condition a radiation beam B (e.g., UV radiation or DUV radiation) a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device, is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
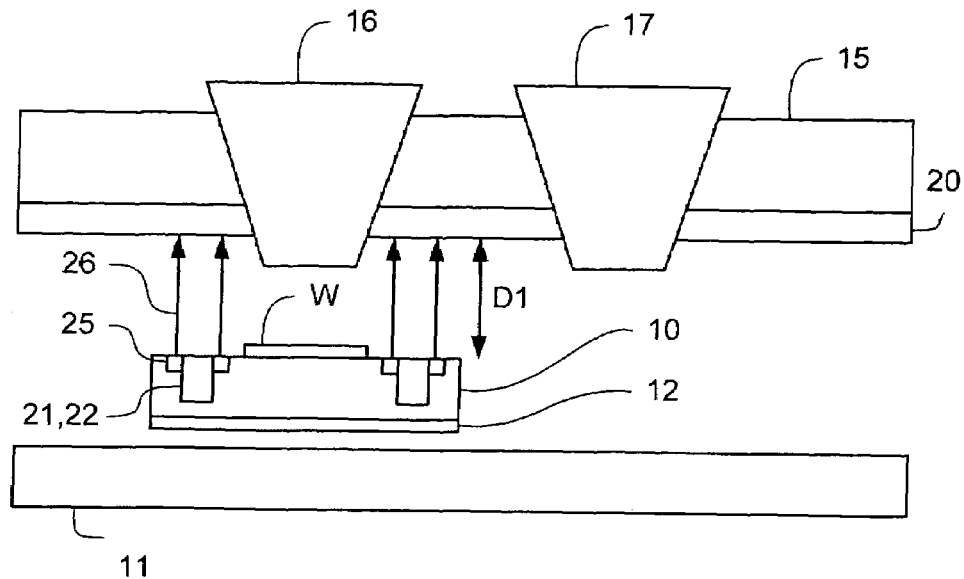
FIGS. 2a and 2b depict, in greater detail, a cross-section of a portion of a lithographic apparatus according to an embodiment of the invention.

FIG. 2a depicts the cross-section of part of the lithographic apparatus according to an embodiment of the present invention. Although the description that follows relates to systems for measuring the position and/or movement of the substrate table of a lithographic apparatus, it should be appreciated that the system may equally be used to measure the position and/or movement of other components of a lithographic apparatus such as, for example, a support constructed to support a patterning device such as a reticle. As shown, a substrate support 10 is provided which supports a substrate W. In the example shown, the substrate support 10 is mounted above a table of magnets 11 and includes a coil unit 12. The coil unit 12 is constructed to be used in conjunction with the magnet plate 11 to form a planar motor which functions as an actuator to move the substrate support 10. It will be appreciated that any convenient form of actuator may be used with the embodiment of the present invention to control the position of the substrate support 10.

The planar motor 11, 12 is used to adjust the position of the substrate support 10 relative to a reference frame 15. A metrology system 16 and a projection system 17 are mounted to the reference frame 15. Accordingly, adjusting the position of the substrate support 10 relative to the reference frame 15 correspondingly adjusts the position of the substrate W relative to the position of the measurement system 16 and the projection system 17, as desired.

In order to monitor the position of the substrate support 10 relative to the reference frame 15, the embodiment of the present invention provides a measurement system including a target 20, a radiation source 21 configured to project a beam of radiation to the target and a sensor 22 configured to detect a pattern of radiation propagating from the target. The pattern of radiation detected by the sensor is indicative of the position and/or movement of the target 20 relative to the source 21 and/or sensor 22. In the example shown in FIG. 2a, the measurement system is a grating encoder. Accordingly, in this arrangement, a grating 20 is attached to the reference frame 15 and used as the target. The radiation source 21 and the sensor 22 are mounted to the substrate support 10. It will be appreciated that other configurations of measurement systems, for example interferometers, may also be used. In a typical configuration, the substrate support 10 is configured to move within a plane depicted as the horizontal plane in FIG. 2a and to maintain a substantially constant vertical position. It should be appreciated, however, that the invention is not limited to such arrangements. In a typical configuration, the distance D1 between the sensor 22 and the target 20 may be set to a value of the order of between about 8 mm and about 20 mm.

Figure 2B:
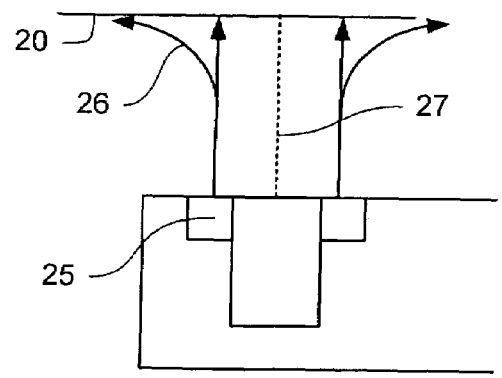
Figure 2C:
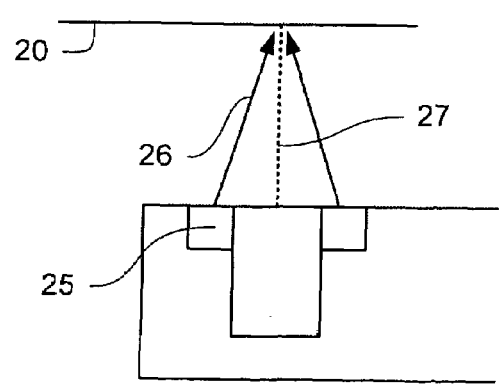
FIG. 2c depicts a variant of the embodiment shown in FIGS. 2a and 2b.

The measurement system of the embodiment of the present invention further includes one or more gas outlets 25 provided on the substrate support 10 and arranged to provide a flow of gas 26. The gas outlets 25 are configured such that the flow of gas 26 from the outlets 25 encapsulates the beam of radiation propagating from the source to the target 20. As depicted in FIG. 2b, the flow of gas 26 is directed to the target 20 which deflects it outwards. Although, as depicted in FIG. 2b, the outlets 25 may be configured to direct the flow of gas 26 such that the flow of gas from all of the outlets is parallel to the beam of radiation projected to the target, some or all of the gas outlets 25 may be arranged in the manner depicted in FIG. 2c, namely angled inwards towards the beam of radiation 27.

The flow of gas 26 shields the volume of space through which the beam of radiation propagates to the target such that variations of, for example the temperature and/or pressure and/or chemical composition of the gas in the remainder of the apparatus do not affect the temperature and/or pressure and/or chemical composition of the gas through which the beam of radiation propagates to an extent that results in measurement errors beyond those which are acceptable. It is appreciated, therefore, that the gas in the volume of space through which the beam of radiation propagates to the target may be of a significantly higher pressure than the pressure of the gas in the remainder of the apparatus. The configuration of the gas outlets may be such that the flow of gas 26 provides a shield around the gas through which the beam of radiation propagates and prevents gas originating from the remainder of the apparatus from entering this volume.

The gas may be provided to the gas outlets 25 using an umbilical connection between a gas supply and the substrate support 10 and internal gas channels (not shown) within the substrate support 10. The gas supplied may be a supply of a substantially pure gas, such as an inert gas, for example $N_2$. Alternatively, the gas may be simply air. In this case, the air may be cleaned in order to remove any particles and/or contaminants. The air may also be humidified, for example to a relative humidity of from about 50% to about 95%. The gas supplied to the gas outlet 25 may be temperature controlled, for example to have the same temperature as the substrate holder 10, for example approximately 22° C.

In a further alternative embodiment, the gas supplied to the gas outlet 25 may be air extracted from the environment immediately surrounding the substrate support 10. For example, an air blower may be provided to provide the flow of gas, mounted on the base frame of the lithographic apparatus or within the substrate support 10, drawing in air from the surrounding environment. For example, if the measurement system is only to be used to measure horizontal movements of the substrate support 10, namely perpendicular to the direction of the beam of radiation 27, it may be formed from an encoder that compares information from two parts of the beam of radiation 27 which are close together. The accuracy of the encoder is determined by any change of the difference of the refractive index between the two parts of the beam of radiation 27. Accordingly, absolute changes of temperature, pressure or composition of the gas do not result in errors in such a system provided they are the same for both parts of the beam of radiation 27. Therefore, provided the flow of gas 26 from all of the gas outlets 25 surrounding the beam of radiation 27 is homogenized the effect of any changes in the gas temperature, pressure or composition over time will have a minimal effect on the accuracy of the measurement system. Accordingly, as described above, the gas supplied to the gas outlets 25 may be that drawn from the environment surrounding the substrate support 10, provided it is homogenized before being provided to the gas outlets 25.

Figure 3A:
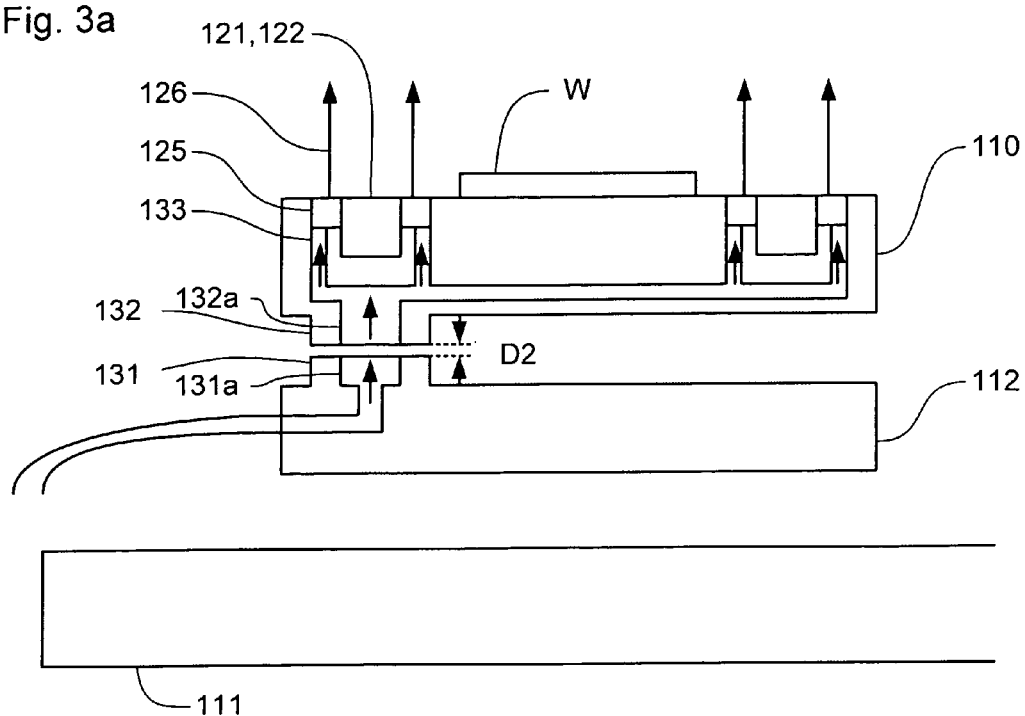
FIGS. 3a and 3b depict a cross-section of a portion of a lithographic apparatus according to an embodiment of the invention.

FIG. 3*a* depicts in detail a substrate support 110 according to an embodiment of the invention. The embodiment of FIG. 3*a* is similar to the embodiment of FIGS. 2*a-c* and only the differences thereof will be described.

As depicted, the substrate support 110 is configured to support a substrate W. The substrate support 110 includes at least one radiation source 121 and sensor 122, configured to project a beam of radiation to a target and detect a pattern of radiation propagating from the target, indicative of the position and/or movement of the target relative to the source 121 and/or the sensor 122. Gas outlets 125 are arranged, surrounding the radiation source 121 and sensor 122 in order to provide a flow of gas 126 that shields the volume of space through which the beam of radiation propagates to the target.

In the embodiment of FIG. 3*a*, the substrate support 110 is positioned using a two-stage actuation system. A long-stroke stage 112 is positioned relative to, for example, a base frame 111 of the lithographic apparatus by using an actuator system as described above, for example a planar motor. The position of the substrate support 110 is adjusted relative to the long-stroke stage 112 using a further actuator system (not shown for clarity), for example a six degree of freedom Lorentz actuator system. The short-stroke actuator system is used in order to provide the required accuracy of positioning of the substrate support 110. In order to assist this, the substrate support 110 may be mounted such that the transference of external vibrations, for example, to the substrate support 110 is minimized. Therefore, an arrangement such as that depicted in FIG. 3*a* may be used such that the gas from the gas flow 126 may be provided to the gas outlets 125 without requiring an umbilical connection to the substrate support 110. For example, this may prevent the transfer of vibrations generated by a fan used to provide the flow of gas to the substrate support 110. In addition, it may prevent forces acting on the substrate support 110, caused by the need to accelerate the umbilical connection with the substrate support 110.

In order to provide the gas flow the substrate support 110 without an umbilical connection, a contactless gas transfer system may be provided. In such an arrangement, the long-stroke stage 112 and the substrate support 110 may include respective protrusions 131,132, having a gas outlet 131*a* and a gas inlet 132*a*, respectively. The gas outlet 131*a* of the long-stroke stage 112 is aligned with the gas inlet 132*a* of the substrate support 110 such that gas flowing from the former is directed to the latter. The gas inlet 132*a* of the substrate support 110 is connected to internal conduits 133 that provide the flow of gas to the gas outlets 125. A relatively small separation D2 is maintained between the protrusions 131,132 of the long-stroke stage 112 and the substrate support 110, such that the gas flow escaping, namely not being transferred into the substrate support 110, is minimized while ensuring that there is not contact between the long-stroke stage 112 and the substrate support 110 by the respective protrusions 131,132. It should be appreciated that the vertical stroke of the short-stroke actuator system, therefore, is less than the separation D2. Likewise, the horizontal stroke of the short-stroke actuator system is smaller than the size of the protrusions 131,132 such that the gas outlet 131*a* of the long-stroke stage and the gas inlet 132*a* of the substrate support 110 remain substantially aligned throughout the stroke of the short-stroke actuator system.

Figure 3B:
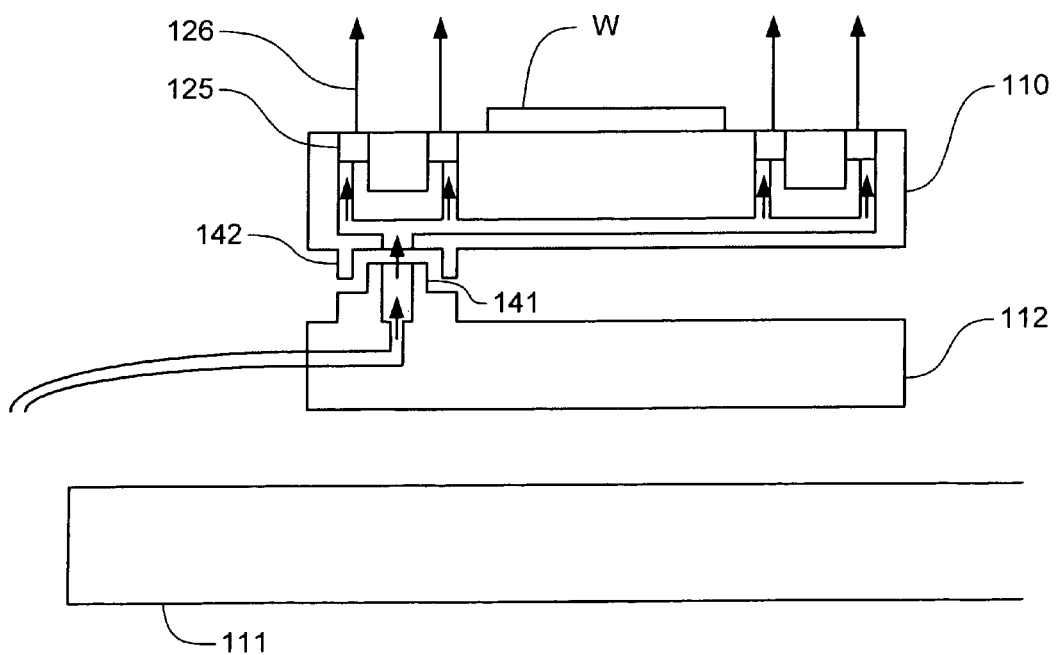

A variant of the embodiment of FIG. 3*a* is depicted in FIG. 3*b*. As depicted, in this variant, the protrusion 142 of the substrate support 110 is formed as a collar such that the protrusion 141 of the one-stroke stage fits within the protrusion 142 of the substrate support 110, reducing the leakage of gas flow. It should be appreciated that this arrangement could be inverted, namely the protrusion on the long-stroke stage may be formed as a collar surrounding the protrusion on the substrate support 110.

In relation to either of the arrangements depicted in FIGS. 3*a* and 3*b*, it should be appreciated that the gas supply may be connected to the long-stroke stage 112 using an umbilical. Alternatively, in the case that the gas is to be drawn from the environment surrounding the substrate support as described above, the gas intake and fan for generating the air flow may be mounted directly to the long-stroke stage.

Figure 4:
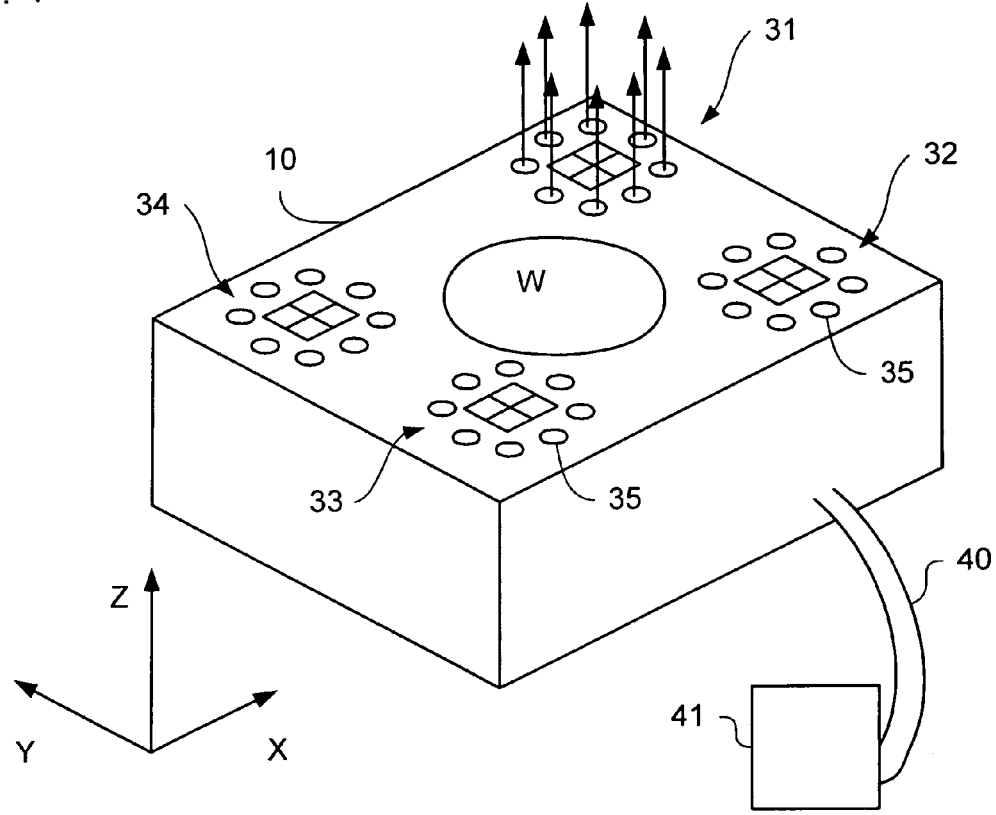
FIG. 4 depicts a substrate support according to an embodiment of the present invention.

FIG. 4 depicts a substrate support 10 that may be used with either embodiment discussed above, in more detail. As shown, the measurement system includes four sets 31, 32, 33, 34 of radiation sources and radiation sensors. In the arrangement shown, each set 31, 32, 33, 34 includes two radiation sources and associated sensors. The sets are arranged at the four corners of the substrate support 10. Each of the sets 31, 32, 33, 34 includes a radiation source and sensor configured to measure the position and/or movement of the substrate support 10 in the Z direction, namely in a direction perpendicular to the surface of the substrate W. Two measurement sets 31, 33, arranged on opposite corners of the substrate holder 10 further include radiation sources and sensors to measure the position and/or displacement of the substrate support 10 in the Y-direction, namely in a first direction within a plane parallel to the surface of the substrate W. The remaining measurement sets 32, 34, arranged at the remaining two opposite corners, further include radiation sources and sensors configured to measure the position and/or movement of the substrate support 10 in the X-direction, namely in a second direction within a plane parallel to the surface of the substrate W and perpendicular to the first direction. As shown in FIG. 4, around each of the measurement sets 31, 32, 33, 34, a plurality of gas outlets 35 are provided. The gas outlets 35 are configured to provide a flow of gas that encapsulates the volume of space through which the radiation beams from each set propagate to the target. Accordingly, each measurement set 31, 32, 33, 34 is provided with its own controlled environment.

It will be appreciated that a different arrangement to that depicted in FIG. 4 may be used. In particular, the measurement sets may be differently distributed around the substrate support 10 and/or different combinations of measurement sets may be used. Furthermore, within each measurement set, the systems may be combined. For example, a measurement set may have a single radiation source and/or a single sensor used to measure the position and/or movement of the substrate support 10 in two or more directions. Likewise, the measurement sets may be divided and a separate gas flow may be provided to shield the beam of radiation used for each sensor. In addition, a radiation source and associated sensor may be arranged set apart from each other on the substrate support 10. In this case, separate gas outlets providing a separate gas flow shield may be provided for the radiation propagating from the radiation source of the target to the radiation propagating from the target to the sensor. It should also be appreciated that, for some measurement systems, the radiation sensor may be mounted to the reference frame. In this case, the flow of gas may only shield the radiation propagating from the source to the target.

Figure 5:
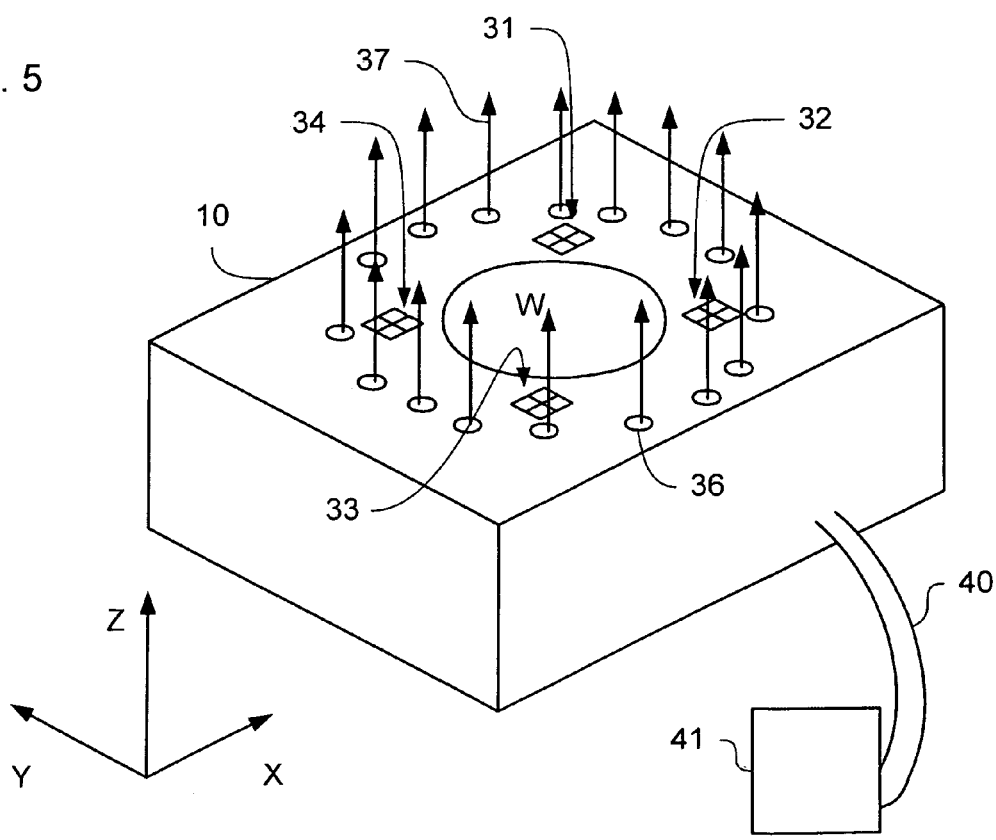
FIG. 5 depicts a substrate support according to an embodiment of the present invention.

In an alternative embodiment depicted in FIG. 5, the gas outlets may be arranged to provide a flow of gas that encapsulates the space above a portion of the substrate support. A plurality or all of the measurement sets may be arranged within the space surrounded by the gas flow. For example, as shown, the gas outlets 36 may be arranged to surround the substrate and the measurement sets 31,32,33, 34. Accordingly, the volume of space segregated from the gas in the remainder of the apparatus is larger than in the arrangement discussed above. However, the gas flow 37 in this case also may reduce the flow of particles into the space above the substrate W, reducing contamination of the substrate. Furthermore, the flow of gas 37 may assist in flushing away from the substrate W particles released by the exposure of the substrate.

As discussed above, and as depicted in FIGS. 4 and 5, the substrate support 10,110 of any of the embodiments discussed above may be provided with the supply of gas using an umbilical connection 40 which may also connect the radiation sources and sensors to the control system of the lithographic apparatus. Alternatively, the gas supply may be provided to the substrate support 110 using a contactless connection. In any event, a gas flow controller 41 may be provided in order to control the flow of gas to the gas outlet.

As shown in FIGS. 4 and 5, the gas flow controller 41 may be mounted separately from the substrate support 10. Alternatively or additionally, a gas flow controller may be incorporated within the substrate support 10 or, if applicable, in the long-stroke stage 112. The gas flow controller may be arranged to control the flow of gas to all of the gas outlets together. Alternatively, it may be possible to adjust the flow to different outlets and/or different groups of outlets associated with different measurement sets. In any case, the flow of gas provided to the gas outlet may be selected in order to ensure that the volume of space, through which the relevant beam of radiation propagates, is sufficiently encapsulated by the flow of gas for all expected operating conditions of the lithographic apparatus that the required measurement accuracy is provided.

It will be appreciated that the faster the substrate support 10 moves, the greater the flow of gas may be needed from the gas outlets. In particular, the system may be configured such that the average speed in a radial direction, away from the beam of radiation propagating to the target, at the point where the gas exits the volume of space encapsulated by the gas, is greater than the speed of movement of the substrate support 10. The gas flow controller 41 may be configured to adjust the flow of gas provided to the gas outlets. For example, the gas flow controller 41 may be configured to provide a lower flow rate when the substrate support 10 is stationery or moving relatively slowly and a higher flow rate when the substrate support 10 is moving relatively quickly. The gas flow controller 41 may further control the distribution of the gas to the gas outlets around a measurement set depending on the direction of movement of the substrate support 10. For example, the gas flow controller 41 may direct a larger proportion of the gas provided to the outlets provided around a given measurement set that are on the upstream side of the measurement set for a given direction of movement of the substrate table 10 than to the outlets on the downstream side.

Figure 6A:
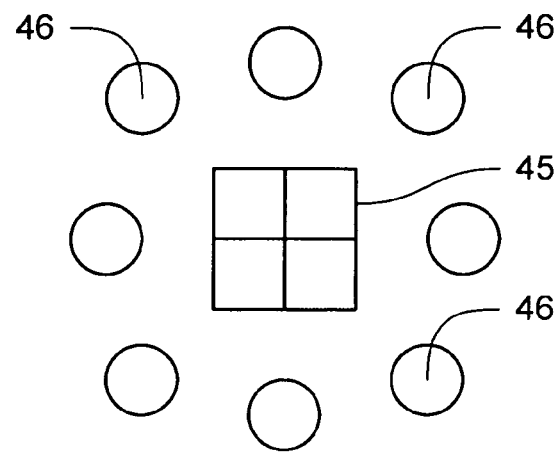
FIGS. 6a, 6b, 6c and 6d depict alternative configurations of gas outlets according to an embodiment of the present invention.
Figure 6B:
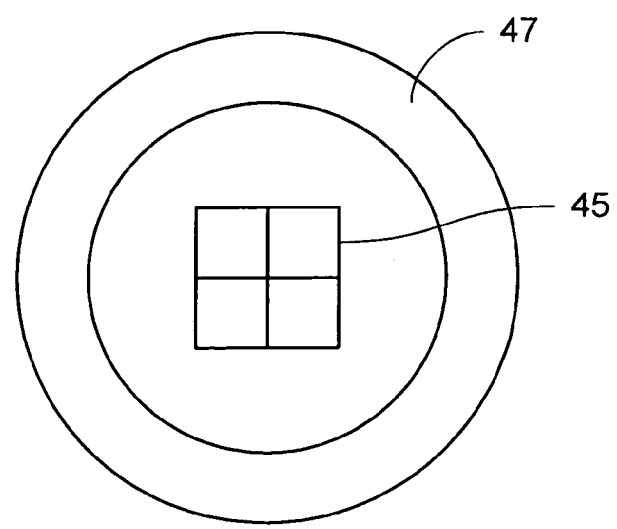
Figure 6C:
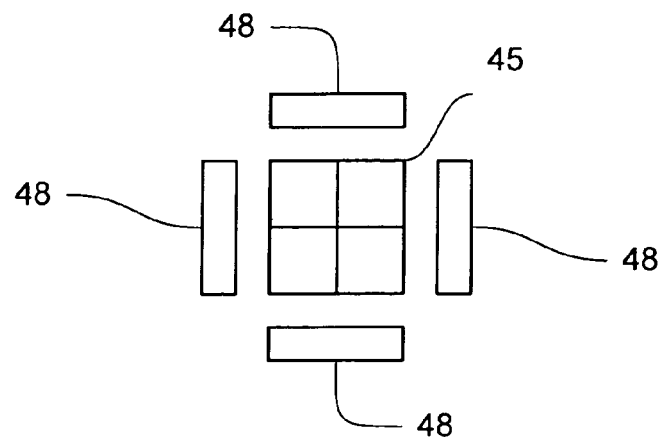
Figure 6D:
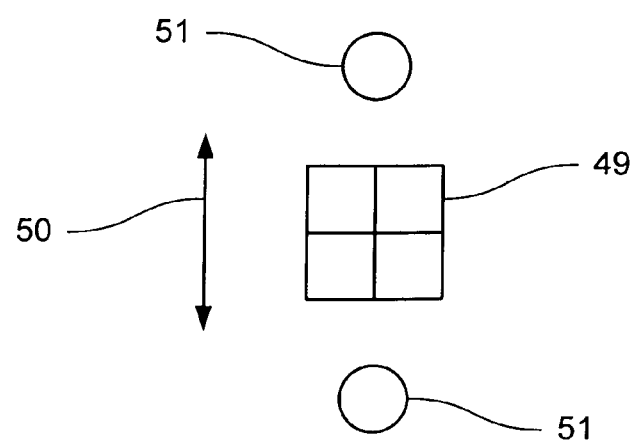

As discussed above, and as depicted in plan view in FIG. 6*a*, each volume of space to be shielded by a flow of gas, for example the space above a measurement set 45, may be surrounded by a plurality of separate gas outlets 46. As an alternative, the measurements set 45, for example, may be surrounded by a single annular-shaped gas outlet 47, as shown in FIG. 6*b*. As a further alternative, it should be appreciated that the gas outlets 48 may be elongate slit-shaped, for example as shown in FIG. 6*c*. It should further be appreciated that it may not be necessary to provide gas outlets on every side of a measurement set. For example, as depicted in FIG. 6*d*, if, while a measurement set 49 is in use, the substrate support only moves backwards and forwards in a given direction 50, then it may be sufficient to provide gas outlets 51 on either side of the measurement set 49 in that direction. In general, it will be appreciated that any configuration of gas outlet 48 may be used provided that it provides a flow of gas that sufficiently encapsulates the volume of space through which the beam of radiation propagates to the target that a desired measurement accuracy be attained.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus, comprising:
   (i) a reference frame;
   (ii) a measurement system configured to measure at least one of a position and a movement of a component of the lithographic apparatus relative to said reference frame, the measurement system comprising:
      (a) a target mounted to one of said component and reference frame;
      (b) a radiation source mounted to the other one of the component and the reference frame, and configured to project a beam of radiation to said target; and
      (c) a sensor configured to detect a pattern of radiation propagating from the target, said pattern being indicative of said at least one of the position and the movement of the component relative to the reference frame;
   wherein the component comprises one or more gas outlets configured such that, when a gas supply is provided to said gas outlets, a volume of a space through which said beam of radiation propagates to said target is substantially encapsulated by a flow of gas from said one or more gas outlets.

2. A lithographic apparatus according to claim 1, wherein the flow of gas from said one or more gas outlets flushes the volume of the space through which said beam of radiation propagates to said target.

3. A lithographic apparatus according to claim 1, wherein the radiation returning from said target to said sensor is substantially encapsulated by said flow of gas from said one or more gas outlets.

4. A lithographic apparatus according to claim 1, wherein said one or more gas outlets comprises an annular-shaped gas outlet surrounding at least one of said radiation source and said target.

5. A lithographic apparatus according to claim 1, wherein said one or more gas outlets comprises a plurality of gas outlets arranged around at least one of said radiation source and said target.

6. A lithographic apparatus according to claim 1, wherein said radiation source is mounted to said component.

7. A lithographic apparatus according to claim 1, wherein a gas supply is connected to a second component of the lithographic apparatus; and the first and second components are constructed to provide a contactless gas flow connection between the two components.

8. A lithographic system comprising:
   a lithographic apparatus that includes
      (i) a reference frame;
      (ii) a measurement system configured to measure at least one of a position and a movement of a component of the lithographic apparatus relative to said reference frame, the measurement system comprising:
         (a) a target mounted to one of said component and reference frame;
         (b) a radiation source mounted to the other one of the component and the reference frame, and configured to project a beam of radiation to said target; and
         (c) a sensor configured to detect a pattern of radiation propagating from the target, said pattern being indicative of said at least one of the position and the movement of the component relative to the reference frame;
      wherein the component comprises one or more gas outlets configured such that, when a gas supply is provided to said gas outlets, a volume of a space through which said beam of radiation propagates to said target is substantially encapsulated by a flow of gas from said one or more gas outlets; and
   a gas supply that is configured to supply a sufficient flow-rate of gas to said one or more gas outlets to ensure that the volume of the space through which said beam of radiation propagates is substantially encapsulated by said flow of gas when said component moves relative to the reference frame.

9. A lithographic system according to claim 8, wherein the gas supply provides a flow of gas such that an average speed of gas, in a direction substantially perpendicular to the direction of propagation of said beam of radiation, exiting the volume of the space encapsulated by the flow of gas exceeds the speed of said component relative to the reference frame.

10. A lithographic system according to claim 8, further comprising a flow-controller configured to control the flow of gas to said one or more gas outlets in order to ensure that the volume of space through which said beam of radiation propagates is encapsulated by the flow of gas.

11. A lithographic system according to claim 10, wherein the flow-controller sets said flow of gas according to the speed of said component relative to the reference frame.

12. A lithographic system comprising a lithographic apparatus according to claim 1 and a gas supply connected to said gas outlets, wherein said gas supply provides a flow of temperature-controlled gas.

13. A lithographic system comprising a lithographic apparatus according to claim 1 and a gas supply connected to said gas outlets, wherein said gas supply provides a flow of one of a substantially pure inert gas, clean air and humidified air.

14. A lithographic apparatus according to claim 1, further comprising a gas supply configured to draw in air from the environment of the lithographic apparatus, homogenize the gas and provide the gas to the gas outlets.

15. A lithographic apparatus according to claim 1, wherein the volume of space encapsulated by the flow of gas from said one or more outlets substantially only encapsulates at least one of said beam of radiation projected to the target and the radiation propagating from the target to the sensor.

16. A lithographic apparatus according to claim 1, wherein the measurement system comprises a plurality radiation sources and associated targets and radiation sensors, arranged around said component such that the measurement system measures at least one of the position and movement of a plurality of parts of the component relative to the reference frame.

17. A lithographic apparatus according to claim 16, wherein said component comprises one or more gas outlets associated with each combination of a radiation source and each of said one or more gas outlets is configured such that, when a gas supply is provided to said gas outlets, the volume of the space through which the associated beam of radiation propagates to said target is substantially encapsulated by a flow of gas from said one or more outlets.

18. A lithographic apparatus according to claim 16, wherein said component comprises one or more gas outlets configured such that, when a gas supply is provided to said gas outlets, the volume of the space through which the radiation beams, projected from the plurality of radiation sources, propagate to the respective targets is substantially encapsulated by a flow of gas from the one or more outlets.

19. A lithographic apparatus according to claim 1, wherein said component is one of a substrate support, constructed to support a substrate, and a support constructed to support a patterning device.

20. A device manufacturing method comprising:
transferring a pattern from a patterning device onto a substrate using a lithographic apparatus,
moving with an actuator a component of the lithographic apparatus relative to a reference frame;
controlling the actuator using a measurement system that is configured to measure at least one of the position and the movement of said component relative to the reference frame the measurement system comprising:
a target mounted to one of said component and the reference frame;
a radiation source mounted to the other of said component and the reference frame, and configured to project a beam of radiation to said target; and
a sensor, configured to detect a pattern of radiation, propagating from the target that is indicative of said at least one of the position and the movement of the component relative to the reference frame; and
supplying a gas to one or more gas outlets provided on the component such that the volume of a space through which said beam of radiation propagates to said target is substantially encapsulated by a flow of gas from said one or more outlets.

21. The method of claim 20, wherein the component a substrate support configured to support the substrate or a patterning device support configured to support the patterning device.

* * * * *